(12) United States Patent
Ware (10) Patent No.: US 9,135,100 B2
(45) Date of Patent: Sep. 15, 2015

(54) COOPERATIVE MEMORY ERROR DETECTION AND REPAIR

(71) Applicant: Micron Technology, Inc., Boise, ID (US)

(72) Inventor: Kurt Ware, Vadnais Heights, MN (US)

(73) Assignee: Micron Technology, Inc., Boise, ID (US)

( * ) Notice: Subject to any disclaimer, the term of this patent is extended or adjusted under 35 U.S.C. 154(b) by 226 days.

(21) Appl. No.: 13/804,071

(22) Filed: Mar. 14, 2013

(65) Prior Publication Data

US 2014/0281686 A1 Sep. 18, 2014

(51) Int. Cl.
| | | |
|---|---|---|
| *G06F 11/00* | (2006.01) | |
| *G06F 11/07* | (2006.01) | |
| *G06F 11/10* | (2006.01) | |
| *G11C 29/04* | (2006.01) | |
| *G11C 29/44* | (2006.01) | |
| *G11C 29/00* | (2006.01) | |

(52) U.S. Cl.
CPC ........ *G06F 11/0751* (2013.01); *G06F 11/1048* (2013.01); *G06F 11/10* (2013.01); *G11C 29/70* (2013.01); *G11C 2029/0401* (2013.01); *G11C 2029/0409* (2013.01); *G11C 2029/0411* (2013.01); *G11C 2029/4402* (2013.01)

(58) Field of Classification Search
CPC ............. G06F 11/0727; G06F 11/073; G06F 11/0751; G06F 11/1048
USPC .............. 714/6.1, 6.11, 6.12, 6.13, 42, 52, 54
See application file for complete search history.

(56) References Cited

U.S. PATENT DOCUMENTS

| | | |
|---|---|---|
| 5,961,653 A | 10/1999 | Kalter et al. |
| 6,012,157 A * | 1/2000 | Lu .................................. 714/741 |
| 6,081,910 A | 6/2000 | Mifsud et al. |
| 6,295,237 B1 | 9/2001 | Pochmuller |
| 6,421,286 B1 | 7/2002 | Ohtani et al. |
| 7,835,207 B2 | 11/2010 | Keeth et al. |
| 7,925,949 B2 | 4/2011 | Jeddeloh |
| 7,978,721 B2 | 7/2011 | Jeddeloh et al. |
| 7,979,757 B2 | 7/2011 | Jeddeloh |
| 8,176,371 B2 | 5/2012 | Jeddeloh |
| 8,254,191 B2 | 8/2012 | Jeddeloh et al. |
| 8,320,206 B2 | 11/2012 | Keeth et al. |
| 2001/0050857 A1 | 12/2001 | Keeth et al. |
| 2008/0126905 A1* | 5/2008 | Deguchi et al. ............... 714/746 |

(Continued)

FOREIGN PATENT DOCUMENTS

| | | | |
|---|---|---|---|
| WO | WO-2010042496 A2 | 4/2010 | |
| WO | WO-2010051461 A1 | 5/2010 | |

(Continued)

*Primary Examiner* — Joseph Kudirka (74) *Attorney, Agent, or Firm* — Schwegman Lundberg & Woessner, P.A.

(57) ABSTRACT

Some embodiments include apparatuses and methods having a memory structure included in a memory device and a control unit included in the memory device. The control unit can provide information obtained from the memory structure during a memory operation to a host device (e.g., a processor) in response to a command from the host device. If the control unit receives a notification from the host device indicating that the host device has detected an error in the information obtained from the memory structure, then a repair unit included in the memory device performs a memory repair operation to repair a portion in the memory structure.

40 Claims, 5 Drawing Sheets

(56) References Cited

U.S. PATENT DOCUMENTS

| | | |
|---|---|---|
| 2010/0005376 A1 | 1/2010 | LaBerge et al. |
| 2011/0040924 A1* | 2/2011 | Selinger .................. 711/103 |
| 2011/0041005 A1* | 2/2011 | Selinger .................. 714/6 |
| 2011/0202813 A1* | 8/2011 | Resnick .................. 714/748 |
| 2011/0264858 A1 | 10/2011 | Jeddeloh et al. |
| 2011/0289349 A1* | 11/2011 | Loeser et al. ............ 714/6.24 |
| 2012/0221911 A1 | 8/2012 | Jeddeloh |
| 2012/0320688 A1 | 12/2012 | Jeddeloh et al. |
| 2013/0003473 A1 | 1/2013 | Keeth et al. |

FOREIGN PATENT DOCUMENTS

| | | |
|---|---|---|
| WO | WO-2010059380 A1 | 5/2010 |
| WO | WO-2010042496 A3 | 7/2010 |

* cited by examiner

COOPERATIVE MEMORY ERROR DETECTION AND REPAIR

BACKGROUND

Electronic items, such as computers, digital televisions, digital cameras, and cellular phones and many other electronic items, often have a memory device to store information. Some conventional memory devices may have error detection and correction capability to detect and correct errors that may occur in the stored information when the stored information is retrieved. Some other memory devices have no error detection and correction capability. Thus, these memory devices may be unsuitable or have limited use in some electronic items.

DETAILED DESCRIPTION

Figure 1:
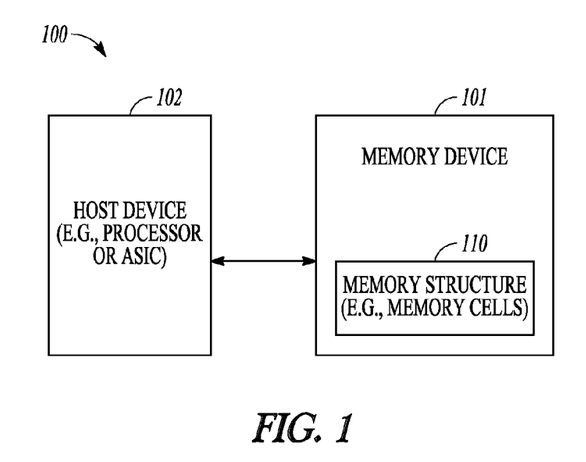
FIG. 1 shows a block diagram of an apparatus including a memory device and a host device, according to some embodiments described herein.

FIG. 1 shows a block diagram of an apparatus 100 including memory device 101 and a host device 102, according to some embodiments described herein. Apparatus 100 can include or be included in electronic items such as computers, digital televisions, digital cameras, and cellular phones and other electronic items. As shown in FIG. 1, memory device 101 can include a memory structure 110 to store information (e.g., user data). Memory device 101 can include a dynamic random access memory (DRAM) device or other types of memory devices. Host device 102 can include a processor (e.g., a general purpose processor), an application-specific processor (e.g., application-specific integrated circuit or ASIC), or other types of processors.

Memory device 101 can perform a memory operation (e.g., a write operation) to store information in memory structure 110. The information to be stored in memory structure 110 can be provided to memory device 101 by host device 102. Memory device 101 can also perform a memory operation (e.g., a read operation) to obtain information from memory structure 110 and provide the obtained information to host device 102.

In some situations, information obtained (e.g., in a read operation) from memory structure 110 may have an error. The error may include only a single bit (e.g., single bit error) having a value (e.g., value obtained from memory structure 110 in a read operation) that is different from an expected value (e.g., the value originally provided by host device 102 to be stored in memory structure 110 in a write operation). The error may also include multiple bits (e.g., multiple bit errors) having values that are different from expected values. The error (e.g., single bit error or multiple bit errors) in information obtained from memory structure 110 may be caused by a portion (one or more memory cells used to store the information) in memory structure 110 being defective.

Memory device 101 may not be configured to perform an error detection operation on information obtained from memory structure 110. Thus, memory device 101 may not be configured to determine whether information obtained (e.g., in a read operation) from memory structure 110 has an error. For example, memory device 101 may not include an error management unit (e.g., an error correction code (ECC) engine and associated error detection engine) to detect errors (if any) in the information obtained from memory structure 110. In an alternative arrangement, memory device 101 may include such an error management unit. However, memory device 101 may be configured to disable such an error management unit when memory device 101 is arranged with another device, such as host device 102 in FIG. 1. Alternatively, memory device 101 may be configured to keep such error management unit enabled in order to perform an error detection operation, an error correction operation, or both, in addition to an error detection operation, error correction operation, or both performed by host device 102.

Host device 102 can be configured to determine whether information obtained from memory structure 110 has an error. For example, host device 102 may include an error management unit (e.g., an ECC engine and associated error detection engine, not shown in FIG. 1) to detect errors (if any) in the information obtained from memory structure 110. The information obtained from a memory structure (e.g., memory structure 110) described herein may include user data that has previously been stored in the memory structure 110 in a memory operation (e.g., a normal write operation). Thus, the information obtained from memory structure 110 may exclude (in other words, may not include) test data (e.g., test patterns) that may be used to test memory device 101 during a test.

Memory device 101 and host device 102 can be configured to communicate with each other, such that only host device 102 can be configured to detect errors in information obtained from memory structure 110. Host device 102 may not be configured to perform a memory repair operation to memory structure 110. If the error is detected by host device 102, it sends a notification to memory device 101 indicating that the information obtained from memory structure 110 has an error. Memory device 101 may perform a memory repair operation if memory device 101 receives a notification from host device 102 indicating that the information obtained from memory structure 110 has an error.

In a memory repair operation, memory device 101 can generate a repair record that may include information identifying a defective portion in memory structure 110 and a portion in memory structure 110 that replaces the defective portion. The defective portion may still exist in memory device 101 after a memory repair operation. However, based on the repair record, memory device 101 may use a portion (e.g., spare portion) that replaces the defective portion to store information that is intended to be stored in the defective portion. A "defective" portion in a memory structure (e.g., memory structure 110) described herein may include both a portion of the memory structure that is actually defective and a portion that has been deemed to be "defective", regardless of whether the portion that has been deemed to be "defective" is actually defective.

One of ordinary skill in the art may realize that memory device 101 and host device 102 may include other elements, several of which are not shown in FIG. 1, so as not to obscure the example embodiments described herein.

Memory device 101 and host device 102 can include a memory device and a host device similar to, or the same as, those of apparatuses described below with reference to FIG. 2 through FIG. 8.

Figure 2:
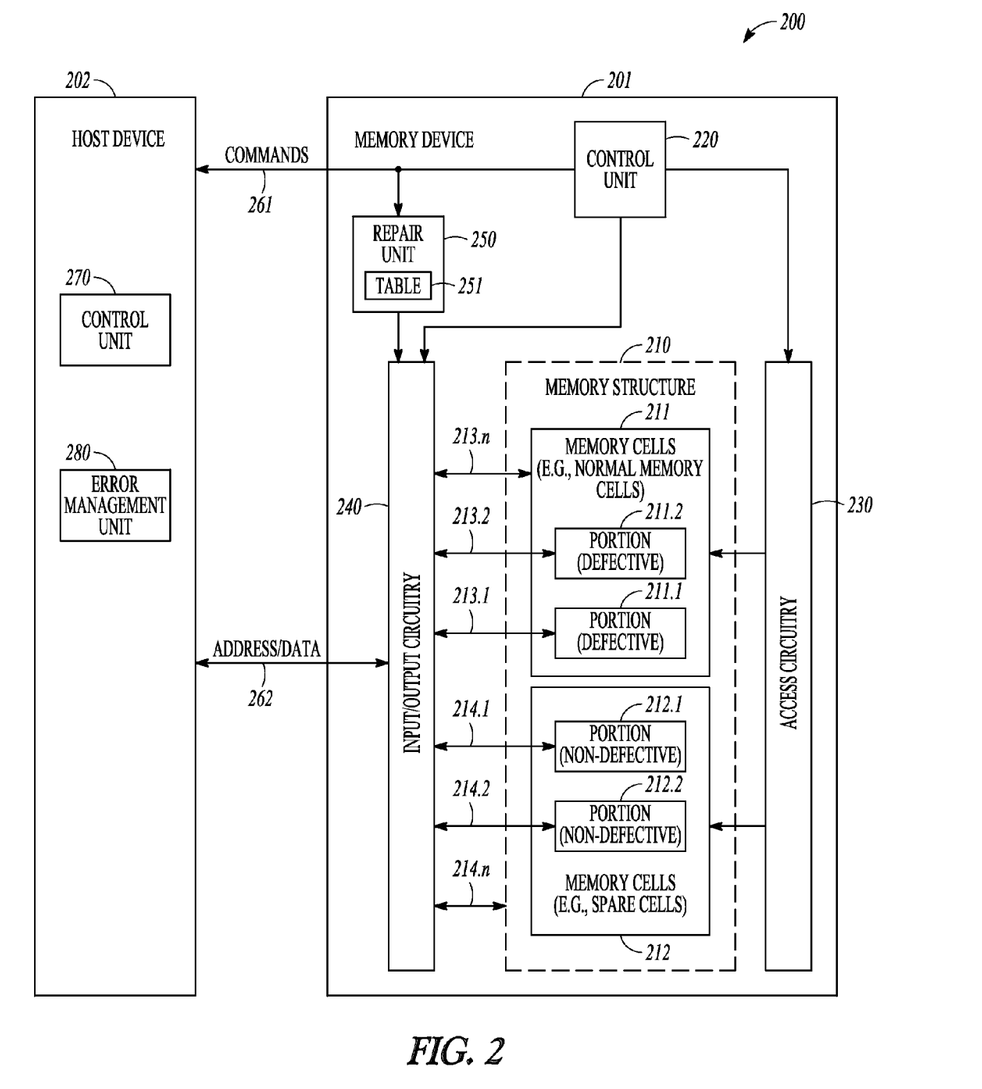
FIG. 2 shows a block diagram of an apparatus including a memory device having a repair unit and a host device having an error management unit, according to some embodiments described herein.

FIG. 2 shows a block diagram of an apparatus 200 including memory device 201 having a repair unit 250 and a host device 202 having an error management unit 280, according to some embodiments described herein. Memory device 201 and host device 202 can correspond to memory device 101 and host device 102, respectively, of FIG. 1.

As shown in FIG. 2, apparatus 200 can include connections 261 and 262 to allow memory device 201 and host device 202 to exchange (e.g., send and receive) information with each other. Each of connections 261 and 262 can include one or more conductive paths, such as metal traces on a circuit board or other electrical connections.

The information on connections 261 and 262 can include commands (e.g., on connection 261) and address and data (e.g., on connection 262). The commands can include a command (e.g., a write command generated by host device 202) associated with storing (e.g., writing) information in memory structure 210 of memory device 201. The commands can also include a command (e.g., a read command generated by host device 202) associated with obtaining (e.g., sensing) information from memory structure 210. Other commands may be communicated on connection 261.

The address on connection 262 can include an address (e.g., address provided by host device 202) associated with one or more memory cells in memory structure 210. The data on connection 262 can include data provided by host device 202 to be stored in memory structure 210 (e.g., in a write operation). The data on connection 262 can also include data obtained from memory structure 210 (e.g., in a read operation) to be provided to host device 202.

Memory device 201 can include a memory structure 210 having memory cells 211 and 212 to store information (e.g., user data) and access circuitry 230 to access memory structure 210 during a memory operation. Memory device 201 can include a control unit 220 that can be programmed or otherwise configured to control and perform operations in memory device 201, as described herein. Control unit 220 and repair unit 250 are shown as separate units in memory device 210 as an example. Control unit 220 and repair unit 250, however, can be arranged in the same unit.

Memory device 201 can also include input/output circuitry 240 to receive (e.g., during a write operation) information (e.g., data) sent by host device 202 to memory device 201 to be stored in memory structure 210. Input/output circuitry 240 can send (e.g., during a read operation) information (e.g., data) obtained from memory structure 210 to host device 202.

Memory cells 211 can be configured as normal memory cells (e.g., functional memory cells), such that they can be organized into a memory space that can be accessed by a host device 202. Memory cells 212 can be configured as spare memory cells (e.g., redundant memory cells) to replace a defective portion of memory cells 211. A defective portion of memory cells 211 can include only a single memory cell (e.g., a single defective memory cell) or multiple memory cells (e.g., multiple defective memory cells).

Memory device 201 can include signal paths 213.1, 213.2, and 213.n to carry information between memory cells 211 and input/output circuitry 240. Memory device 201 can include signal paths 214.1, 214.2, and 214.n to carry information between memory cells 212 and input/output circuitry 240. FIG. 2 shows six signal paths as an example. The number of signal paths can vary.

Control unit 220 can interpret commands (e.g., in the form of electrical signals) sent to memory device 201 on connection 261 by host device 202 and cause memory device 201 to perform appropriate operations (e.g., read, write, or memory repair operation). For example, control unit 220 can cause memory device 201 to perform a write operation to store information in memory structure 210 in response to a write command on connection 261. In another example, control unit 220 can cause memory device 201 to perform a read operation to obtain information from memory structure 210 in response to a read command on connection 261. Control unit 220 can provide (through input/output circuitry 240) information obtained from memory structure 210 during the read operation to host device 202.

Repair unit 250 can be programmed or otherwise configured to perform operations as described herein. For example, repair unit 250 can perform a memory repair operation to repair a defective portion in memory structure 210. In a memory repair operation, repair unit 250 may not physically repair a defective portion in memory cells 211. Rather, repair unit 250 may change routing of signals to and from a defective portion and generate a repair record that may include information identifying a defective portion in memory cells 211 and a non-defective portion (e.g., spare portion) in memory cells 212 that replaces the defective portion. Repair unit 250 may perform a memory repair operation to repair a portion in the memory structure 210 if memory device 201 receives (e.g., at control unit 220) a notification from host device 202 indicating that host device 202 has detected an error in the information obtained from the memory structure 210.

Memory device 201 can include a table 251 to store repair records related to memory repair operations performed by memory device 201. The repair records stored in table 251 may include information (e.g., entries in table 251) indicating a link (e.g., an address rerouting map) between an address of a defective portion and an address of a portion (e.g., a replacement portion) that replaces the defective portion. The addresses in table 251 can include row and column addresses of a memory cell (or memory cells) in a defective portion and in a replacement portion. In each memory operation (e.g., each write or each read operation), memory device 201 may use (e.g., check) table 251 to determine whether to access a replacement portion (instead of accessing a defective portion) to store information (e.g., in a write operation) in the replacement portion or to obtain information (e.g., in a read operation) from the replacement portion.

FIG. 2 shows an example of table 251 being part of repair unit 250. Table 251, however, can be part of any component in memory device 201. For example, table 251 can be part of control unit 220. Table 251 can be implemented by software, firmware, or hardware, or any combination of software, firmware, and hardware.

Details of memory repair operations (e.g., repair records) performed by memory device 201 may be known to only memory device 201 and not to host device 202. Host device 202 may not be configured to store information associated with memory repair operations performed by memory device 201. Thus, host device 202 may be unaware of whether a portion (e.g., portion 211.1) of memory cells 211 is defective. Even if a portion (e.g., portion 211.1) of memory cells 211 is defective, host device 202 may also be unaware of whether such a portion has been replaced with a non-defective portion of memory cells 212.

Host device 202 can include a control unit 270 and an error management unit 280. Control unit 270 and error management unit 280 can be programmed or otherwise configured to perform operations described herein. Control unit 270 can generate different commands for different operations to be performed by memory device 201. For example, control unit 270 can generate a write command associated with an operation of storing information in memory device 201 and a read command associated with an operation of obtaining information from memory structure 210. Control unit 270 can also generate a notification to be sent to memory device 201 to notify memory device 201 that the information obtained from memory structure 210 has an error if the error is detected by host device 202 during an error detection operation performed by host device 202.

Error management unit 280 of host device 202 can be configured to perform an error detection operation on information obtained from memory structure 210 in memory device 201 to determine whether the information has an error. For example, error management unit 280 may include an error detection unit to detect errors in information obtained from memory device 201 in a read operation. FIG. 2 shows control unit 270 and error management unit 280 as separate units of host device 202 as an example. Control unit 270 and error management unit 280, however, can be arranged in the same unit of host device 202.

FIG. 2 shows an example of portion 211.1 of memory cells 211 of memory device 201 that may be determined to be a defective portion. In this example, table 251 may include a repair record indicating a link between the address of portion 211.1 (e.g., a defective portion) and the address of portion 212.1 (e.g., a replacement portion). The repair record in this example may be generated by memory device 201 after it performs a memory repair operation to repair portion 211.1. Based on this repair record in table 251, memory device 201 can change (e.g., reroute) signal path 213.1 associated with portion 211.1 to signal path 214.1 associated with portion 212.1 during a memory operation (a read or write operation). For example, in a write operation, memory device 201 can reroute information (e.g., data provided by host device 202 in a write operation) intended to be stored in portion 211.1 through signal path 213.1 to signal path 214.1, so that the information can be stored in portion 212.1 (e.g., a replacement non-defective portion) instead of portion 211.1 (e.g., defective portion). In a read operation, if information is to be obtained from portion 211.1 (e.g., requested by host device 202), memory device 201 can obtain information from portion 212.1 instead of from portion 211.1. Then memory device 201 can provide the obtained information to signal path 214.1, so that the obtained information can be provided to host device 202 through input/output circuitry 240.

In the above example, portion 211.1 may be determined to be defective during manufacturing of memory device 201. For example, test equipment may be used to perform a test (e.g., probe test) on memory device 201 during manufacturing of memory device 201. Portion 211.1 may be determined to be defective (e.g., by test equipment) during the test. Repairing a defective portion (e.g., portion 211.1) in this example (e.g., based on a test at the factory) may be referred to as a factory repair.

The following description shows an example of another defective portion in memory device 201 and another memory repair operation (e.g., field repair). This example assumes that portion 211.2 of memory device 201 has become defective during the working life of memory device 201 (e.g., after memory device 201 is delivered to a customer or used by a user). Repairing a defective portion (e.g., portion 211.2) in this example may be referred to as a field repair (e.g., post-manufacturing repair). This example also assumes that a memory repair operation has not been performed to repair portion 211.2. Thus, table 251 may not include a repair record associated with portion 211.2. The following description describes an example memory repair operation to repair portion 211.2 after an error is detected by host device 202 in an example read operation.

In the example read operation, memory device 201 accesses portion 211.2 and obtains (e.g., senses) information from it based on an address associated with portion 211.2 provided by host device 202. Memory device 201 provides the information obtained from portion 211.2 to input/output circuitry 240 through signal path 213.2. Input/output circuitry 240 in turn provides the information to connection 262.

In the example read operation, host device 202 receives the information from connection 262. Error management unit 280 of host device 202 performs an error detection operation to determine whether the information has an error. The error detection operation may include comparing a value in the information (obtained from memory device 201) with an expected value. The information obtained from memory device 201 is deemed to have an error if a value of at least one bit of the information received by host device 202 is different from an expected value. For example, if the obtained information includes eight bits 11101010 and the expected bits are 10101010, then, host device 202 may determine that an error has occurred. In this example, the error includes only a single error bit (which is the second left-most bit among received bits 11101010) that has an erroneous value of "1" instead of an expected value of "0" among expected bits 1010101010. This example uses eight bits for simplicity. The number of bits (e.g., bits in a packet) included in the information, however, may vary. The information may also include multiple bits having errors.

Host device 202 can be configured to correct the error if the error is detected. For example, error management unit 280 of host device 202 may include an ECC engine and associated error detection and correction engine that may operate to correct eight bits 11101010 (value obtained from the example read operation) having the error, so that eight bits 10101010 (corrected value) can be recovered. Detection and correction of errors (e.g., single bit error and multiple bit error) as described herein can be performed using techniques known to those skilled in the art.

Control unit 270 of host device 202 can notify memory device 201 of the occurrence of the error after host device 202 detects the error. For example, control unit 270 may provide (e.g., send) a notification to memory device 201 via connection 261, 262, or both. The notification may include a command generated by host device 202 to instruct memory device 201 to perform a memory repair operation. Control unit 270 may also provide information identifying the error to memory device 201. As described in more detail below, the information identifying the error (sent from host device 202 to memory device 201) may include an address, a data value, a data mask, and a type of error.

Repair unit 250 of memory device 201 of FIG. 2 can perform a memory repair operation based on the notification and the information identifying the error provided by host device 202 and received by memory device 201 (e.g., received by control unit 220). For example, repair unit 250 can replace portion 211.2 (e.g., defective portion) of memory cells 211 with portion 212.2 (e.g., spare portion) of memory cells 212. In this replacement, repair unit 250 can generate a repair record that can include information indicating a link between the address of portion 211.2 and the address of portion 212.2. Repair unit 250 may update table 251 to include (e.g., store) the repair record (e.g., new repair record) associated with the replacement of portion 211.2. Based on this repair record, if portion 211.2 is addressed by host device 202 in a subsequent memory operation (e.g., write or read operation), memory device 201 may access portion 212.2 (instead of portion 211.2) to store information in portion 212.2 or obtain information from portion 212.2. In this example, repair unit 250 can reroute signal path 213.2 associated with portion 211.2 to signal path 214.2 associated with portion 212.2.

The information in table 251 before the memory repair operation can be different from the information (e.g., updated information) after the repair operation. For example, as described above, before the memory repair operation to replace portion 211.2, the information in table 251 may include a repair record associated with a repair of portion 211.1. Then, after the repair operation of portion 211.2, the information in table 251 can be updated to include a repair record associated with portion 211.2 in addition to the repair record associated with the repair of portion 211.1.

As part of a memory repair operation, memory device 201 may provide an indication to host device 202 to indicate a result of the memory repair operation. For example, memory device 210 may provide an indication to host device 202 to indicate whether the memory repair operation is successful or unsuccessful. Host device 202 may perform different actions depending on the result of the memory repair operation. For example, if host device 202 receives an indication from memory device 201 that the memory repair operation is successful, host device 202 may perform no further actions related to the error. In another example, if host device 202 receives an indication from memory device 201 that the memory repair operation is unsuccessful, host device 202 may perform one or more of the following: notifying the user of an unsuccessful memory repair, switching to using a different memory device, and performing other error mitigation tasks that host device 202 may be configured to perform in response to such unsuccessful memory repair notification sent by memory device 201.

Each of portions 211.1 and 211.2 (e.g., defective portion) described in the above examples can include only a single memory cell or multiple memory cells. Thus, each of portions 211.1 and 211.2 can include only a single defective memory cell or multiple defective memory cells. The multiple memory cells (e.g., defective memory cells) may include all memory cells of a column (or alternatively all memory cells in a row) or may include fewer than all memory cells in a column (or alternatively all memory cells in a row).

Portions 211.1 and 211.2 can include two or more memory cells from the same column (or alternatively from the same row). For example, portion 211.1 can include at least one memory cell (e.g., only a single memory cell or multiple memory cells) from a particular column and portion 211.2 can include at least one memory cell (e.g., only a single memory cell or multiple memory cells) from that same column. In another for example, portion 211.1 can include at least one memory cell (e.g., only a single memory cell or multiple memory cells from a particular row and portion 211.2 can include at least one memory cell (e.g., only a single memory cell or multiple memory cells) from that same row.

Portions 211.1 and 211.2 can include two or more memory cells from different columns (or alternatively from different rows). For example, portion 211.1 can include at least one memory cell (e.g., only a single memory cell or multiple memory cells) from a particular column and portion 211.2 can include at least one memory cell (e.g., only a single memory cell or multiple memory cells) from another column. In another example, portion 211.1 can include at least one memory cell (e.g., only a single memory cell or multiple memory cells) from a particular row and portion 211.2 can include at least one memory cell (e.g., only a single memory cell or multiple memory cells) from another row.

In apparatus 200, different memory repair operations at different times can be combined. For example, a memory repair operation to repair portion 211.1 (e.g., factory repair) and a memory repair operation to repair portion 211.2 (field repair) can be combined. This means that regardless of when a portion of memory is defective, memory device 201 can be configured such that a memory repair operation (e.g., factory repair or field repair) can be performed to correct the defective portion. Therefore, repairing defective portions (e.g., portion 211.1 in a factory repair and portion 211.2 in field repair) as described herein may improve the memory repair efficiency of memory device 201, improve (e.g., optimize) the use of repair resources, maintain proper (e.g., best) latency, and extend the longevity of memory device 201.

The example given above assumes that host device 202 detects an error in information obtained from memory device 201. However, if host device 202 does not detect an error in information obtained from memory device 201, host device 202 does not send a notification and information identifying the error to memory device 201. In this case, memory device 201 does not perform a memory repair operation.

As described in the above example, if host device 202 detects an error in information obtained from memory device 201, host device 202 can notify memory device 201 of an error and provide information identifying the error in information to memory device 201. This information can include an address, a data value, a data mask, and a type of error. Memory device 201 can use this information to perform memory repair operations.

The address included in the information identifying the error sent to memory device 201 from host device 202 can be the same address associated with the information obtained from memory device 201. The address may include an address of only a portion (e.g., a starting address of a bit) of the information obtained from memory device 201. Memory device 201 may be configured to perform a read operation (e.g., burst read operation) such that memory device 201 can access a group of memory cells (e.g., 8, 16, or 32 memory cells) based on a starting address in that group. The address included in the information identifying the error sent to memory device 201 by host device 202 can include such a starting address. Based on this address (e.g., a starting address) and other information (e.g., data value and data mask described below) sent by host device 202, memory device 201 can locate a portion (e.g., a single memory cell or multiple memory cells) in memory structure 210 that is deemed to be defective. Memory device 201 can replace the defective portion with a non-defective portion.

The data value included in the information identifying the error sent to memory device 201 from host device 202 can include the data value of information that host device 202 obtains from memory device 201. Using the same example described above, the data value included in the information identifying the error sent to memory device 201 can include eight bits 11101010 (which is the same as the data value that host device 202 obtains from memory device 201).

Alternatively, the data value included in the information identifying the error sent to memory device 201 from host device 202 can include an expected value that host device 202 expects to obtain from memory device 201. Using the same example described above, the data value included in the information identifying the error sent to memory device 201 can include eight bits 10101010 (which is the data value that host device 202 expects to obtain from memory device 201). Data value 10101010 can be the original data value of eight bits that host device 202 sent to memory device 201 for storing in memory device 201 in a write operation (performed before the example read operation). In another implementation, the data value included in the information identifying the error sent to memory device 201 from host device 202 can include both the obtained data value (e.g., 11101010) and the expected data value (e.g., 10101010).

The data mask included in the information identifying the error sent to memory device 201 from host device 202 may include an indication that identifies one or more error bits among a group of bits associated with the information obtained from memory structure 210 in memory device 201. For example, the data mask included in the information identifying the error sent to memory device 201 from host device 202 may include an indication that identifies the location (e.g., bit position) of the bit (or bits) having the error relative to positions of other bits of the information. Using the same example described above where eight bits 11101010 are received by host device 202, the data mask may include bits 01000000 in which the second bit (bit having value "1") identifies the location (e.g., second bit position from the left) because the bit having the error (among received bits 11101010) is in a second bit position. Memory device 201 may use the data mask to determine the location of a defective portion (e.g., a defective memory cell or defective memory cells) associated with the error and replace the defective portion with a spare portion.

The type of error included in the information identifying the error sent to memory device 201 from host device 202 can include different error types: a repeating error type and an intermittent error type. A repeating error type can include an error that occurs multiple times in multiple read operations (e.g., in two or more consecutive read operations). An intermittent error type can include an error that does not occur multiple times in consecutive read operations.

For example, if host device 202 detects an error in information obtained from a portion in memory device 201 in a read operation (e.g., first read operation), then host device 202 may request an additional read operation (e.g., second read operation) from memory device 201 to obtain information from that same particular location. If host device 202 detects the same error (e.g., the error occurs again) in the additional read operation, then host device 202 may determine that the error is a repeating error type. If host device 202 does not detect the error (e.g., the error does not occur again) in the additional read operation, then host device 202 may determine that the error is an intermittent error type. Two consecutive read operations are used herein as an example. Host device 202, however, may request more than two read operations from memory device 201 to determine whether an error is a repeating error type or an intermediate error. Host devices 202 may be able to correct repeating and intermittent error types. Thus, repeating and intermittent error types may be correctable error types. The type of error included in the information identifying the error sent to memory device 201 from host device 202 can also include an uncorrectable error type. For example, in some cases, host device 202 may detect an error in information obtained from memory device 201 in which the detected error may include multiple error bits. However, in such cases, host device 202 may be unable to correct the detected multiple error bits.

Memory device 201 may use different repair resources to repair memory structure 210 based on different types of errors (e.g., repeating and intermittent error types described above) after memory device 201 receives a notification of the error and the information identifying the error sent from host device 202. For example, memory device 201 may use one type of spare memory (e.g., one-time programmable memory) to replace a defective portion in memory structure 210 associated with the error if the error is a repeating error type. Memory device 201 may use another type of spare memory (e.g., DRAM cells, static RAM cells, or other types of cells) to replace a defective portion in memory structure 210 associated with the error if the error is an intermittent repeating error type. Using different resources for different types of errors may allow efficient use of repair resources, may improve (e.g., reduce) device cost, or both.

In the above description, host device 202 can detect an error in information obtained from memory device 201 during a read operation (e.g., a normal read operation) where the information (e.g., data) is obtained to be used by host device 202 or can be provided to another device. Host device 202, however, can also be configured to cause memory device 201 to perform a read operation only for purposes of checking (by host device 202) whether information stored in memory device 201 has errors. This read operation can be referred to as a "patrol" read operation and can be performed during inactivity time interval in apparatus 200 (e.g., when memory device 201 performs no normal read or write operation). Host device 202 can initiate this read (e.g., patrol read) either periodically or randomly. Performing this read operation (e.g., patrol read) may avoid delay time in comparison to the situation where an error is corrected during a normal read operation. Further, using another entity, such as host device 202 outside memory device 201 to detect errors in information obtained from memory device 201, may allow flexibility in configuring host device 202. For example, host device 202 can be configured to use different error detection and correction techniques tailored to the requirements of apparatus 200 (or a system that includes apparatus 200) to correct errors in the information obtained from memory device 201.

Figure 3:
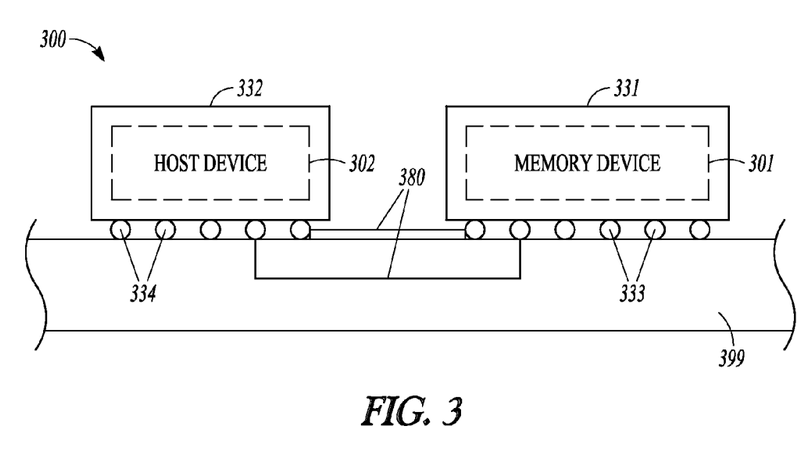
FIG. 3 shows a side view of a portion of an apparatus including a memory device and host device arranged over a base, according to some embodiments described herein.

FIG. 3 shows a side view of a portion of an apparatus 300 including a memory device 301 and host device 302 arranged over a base 399, according to some embodiments described herein. Apparatus 300 can include a die 331 and a die 332 separated from die 331. Each of dice 331 and 332 can include a semiconductor die (e.g., a silicon die). Die 331 can be included in an integrated circuit (IC) package. Die 332 can be included in another IC package physically separated from the IC package that includes die 331. As shown in FIG. 3, memory device 301 can be included in die 331 (e.g., die 331 can include circuitry that forms memory device 301). Memory device 301 can be included in only a single die (e.g., die 331). Alternatively, memory device 301 can be included in multiple dice. Host device 302 can be included in die 332 (e.g., die 332 can include circuitry that forms host device 302). Memory device 301 and host device 302 can correspond to memory device 101 and host device 102, respectively, of FIG. 1, or memory device 201 and host device 202, respectively, of FIG. 2.

Base 399 can include a printed circuit board or other types of structures. Base 399 can include a connection 380 to provide communication between memory device 301 and host device 302. Connection 380 can correspond to a combination of connections 261 and 262 of FIG. 2. As shown in FIG. 3, memory device 301 can include connections 333 coupled to connection 380. Host device 302 can include connections 334 coupled to connection 380. Connections 333 and 334 can include solder balls, conductive pins, or other conductive connections. Connection 380 of base 399 can include conductive paths to carry signals between memory device 301 and host device 302. The conductive paths of connection 380 can include conductive traces (e.g., copper traces). As shown in FIG. 3, a portion (e.g., a group of conductive paths) of connection 380 can be disposed over (e.g., over the surface) of base 399 and another portion (e.g., another group of conductive paths) of connection 380 can be disposed inside base 399.

Figure 4:
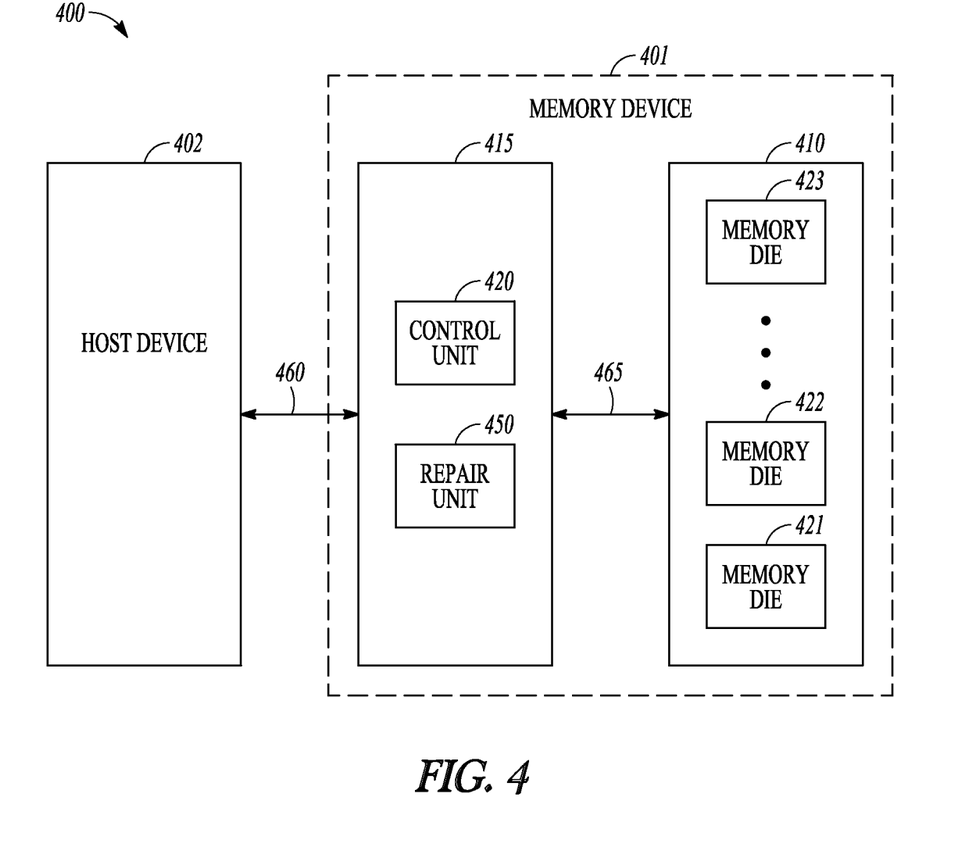
FIG. 4 shows a block diagram of an apparatus including memory dice, a logic die, and a host device, according to some embodiments described herein.

FIG. 4 shows a block diagram of an apparatus 400 including memory dice 421, 422, and 423, a logic die 415, and a host device 402, according to some embodiments described herein. Dice 421, 422, and 423 can be part of a memory structure 410, which can correspond to memory structure 110 (FIG. 1) or memory structure 210 (FIG. 2). FIG. 4 shows memory structure 410 including three memory dice 421, 422, and 423 as an example. Memory structure 410, however, can include fewer or more than three memory dice. Memory structure 410 and logic die 415 can be part of a memory device 401, which can correspond to memory device 101, 201, or 301 described above with reference to FIG. 1, FIG. 2, and FIG. 3. Host device 402 in FIG. 4 can correspond to host device 102, 202, or 302 described above with reference to FIG. 1, FIG. 2, and FIG. 3.

As shown in FIG. 4, memory dice 421, 422, and 423 can communicate with logic die 415 through connection 465. Host device 402 and logic die 415 can communicate with each other through connection 460. Connection 460 can correspond to a combination of connections 261 and 262 of FIG. 2.

In FIG. 4, each of memory dice 421, 422, and 423 can include memory cells (not shown) to store information. The memory cells in each of memory dice 421, 422, and 423 can be arranged in at least one memory array.

Logic die 415 can include control unit 420 and a repair unit 450. Control unit 420 can correspond to control unit 220 of FIG. 2. Thus, control unit 420 can operate in a manner similar to, or the same as, that of control unit 220 of FIG. 2. Repair unit 450 can correspond to repair unit 250 of FIG. 2. Thus, repair unit 450 can operate in a manner similar to, or the same as, that of repair unit 250 of FIG. 2.

Logic die 415 can include circuitry to perform logic-based functions. Logic die 415 can control operations in the memory dice 421, 422, and 423 such that all information (e.g., address, data, and control information) provided to and obtained from memory dice 421, 422, and 423 is conducted through the logic die. For example, information from host device 402 provided to memory dice 421, 422, and 423 (to be stored in memory dice 421, 422, and 423) is conducted through logic die 415. Information obtained from memory dice 421, 422, and 423 to be provided to host device 402 is conducted through logic die 415. Logic die 415 may not be configured to perform an error detection operation on information obtained from memory structure 410 (e.g., from memory dice 421, 422, and 423). In a read operation, host device 402 can obtain information from at least one of memory dice 421, 422, and 423 through logic die 415. Host device 402 can notify logic die 415 to initiate a memory repair operation if host device 402 detects an error in information obtained from at least one of memory dice 421, 422, and 423 during the read operation.

Figure 5:
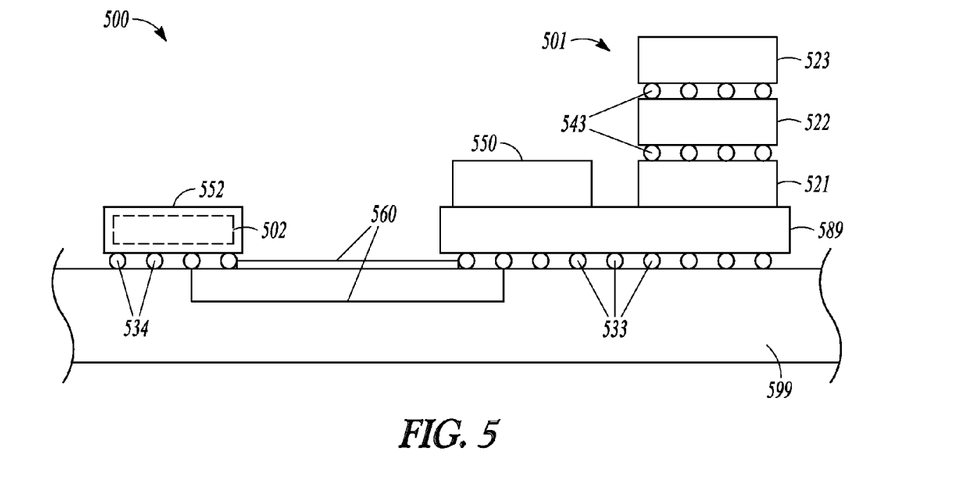
FIG. 5 shows a side view of a portion of an apparatus including memory dice, a logic die, and a host device arranged over a base, according to some embodiments described herein.

FIG. 5 shows a side view of a portion of an apparatus 500 including memory dice 521, 522, and 523, a logic die 550, and a host device 502, arranged over a base 599, according to some embodiments described herein. Host device 502 can be included in a die 552 separated from dice 521, 522, and 523, and logic die 550. Memory dice 521, 522, and 523, logic die 550, and a host device 502 can correspond to memory dice 421, 422, and 423, logic die 415, and host device 402, respectively, of FIG. 4.

As shown in FIG. 5, memory dice 521, 522, and 523 can be arranged in a stack over a support 589. Logic die 550 can be arranged over support 589 and arranged side-by-side with the stack of dice 521, 522, and 523. Support 589 can include a silicon-base support (e.g., a silicon interposer). Dice 521, 522, and 523 and logic die 550 can be part of a memory device 501, which can correspond to memory device 401 of FIG. 4. Memory device 501 in FIG. 5 can be included in a single integrated circuit (IC) package. Thus, dice 521, 522, and 523 and logic die 550 can be included in the same IC package. Die 552 (which includes host device 502) can be included in another IC package physically separated from the IC package that includes memory device 501.

Base 599 can include a printed circuit board or other types of structures. Base 599 can include a connection 560 to provide communication between host device 502 and logic die 550. Connection 560 can correspond to connection 460 of FIG. 4. As shown in FIG. 5, memory device 501 can include connections 533 coupled to connection 560. Host device 502 can include connections 534 coupled to connection 560. Connections 533 and 534 can include solder balls, conductive pins, or other conductive connections. Connection 560 of base 599 can include conductive paths to carry signals between memory device 501 and host device 502. Connection 560 can include conductive traces (e.g., copper traces). As shown in FIG. 5, a portion (e.g., a group of conductive paths) of connection 560 can be disposed over (e.g., over the surface) of base 599 and another portion (e.g., another group of conductive paths) of connection 560 can be disposed inside base 599.

Figure 6:
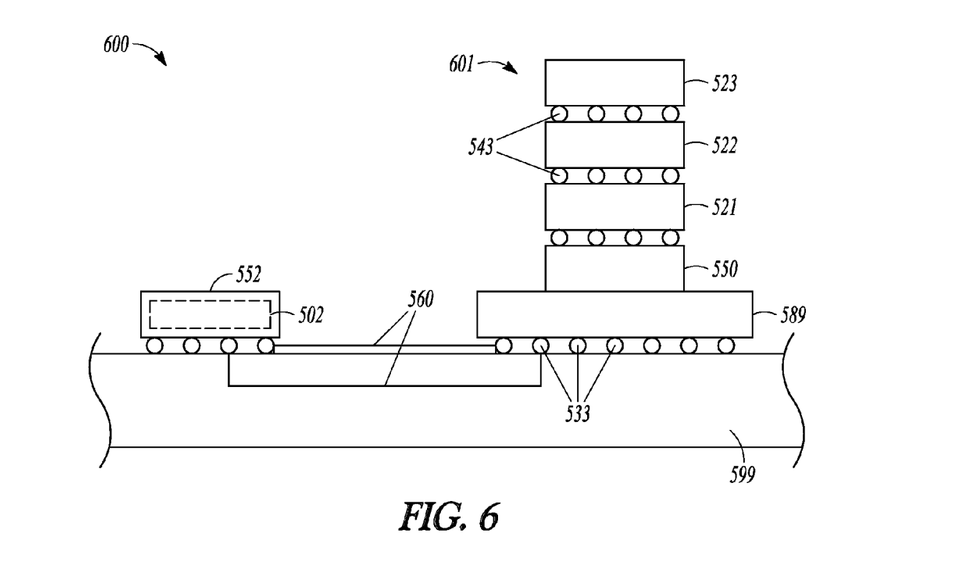
FIG. 6 shows a side view of a portion of an apparatus including memory dice and a logic die arranged in a stack, according to some embodiments described herein.

FIG. 6 shows a side view of a portion of an apparatus 600 including memory dice 521, 522, and 523 and logic die 550 arranged in a stack, according to some embodiments described herein. Dice 521, 522, and 523 and logic die 550 can be part of a memory device 601. Apparatus 600 includes elements similar to, or the same as, those of apparatus 500 (FIG. 5). Similar or the same elements between apparatuses 500 and 600 are given the same designation numbers. The differences between apparatuses 500 and 600 include the arrangement of memory dice 521, 522, and 523 and logic die 550 in FIG. 6. For example, in FIG. 5, logic die 550 can be arranged side-by-side with a stack of memory dice 521, 522, and 523. In FIG. 6, logic die 550 can be arranged in the same stack with memory dice 521, 522, and 523.

Figure 7:
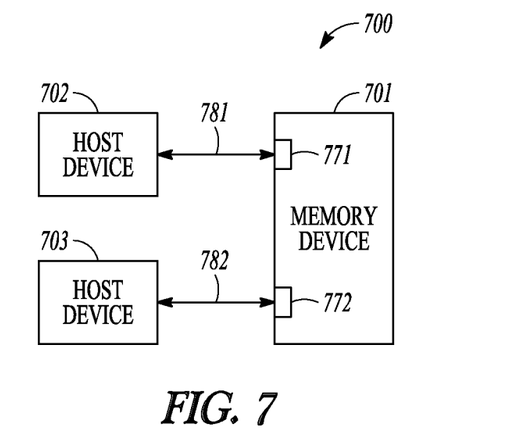
FIG. 7 shows a block diagram of an apparatus including a memory device and multiple host devices, according to some embodiments described herein.

FIG. 7 shows a block diagram of an apparatus 700 including a memory device 701 and multiple host devices 702 and 703, according to some embodiments described herein. Memory device 701 can correspond to memory device 101, 201, 301, 401, 501, or 601, described above with reference to FIG. 1 through FIG. 6. Each of host devices 702 and 703 in FIG. 7 can correspond to host device 102, 202, 302, 402, 502, or 602, described above with reference to FIG. 1 through FIG. 6.

In FIG. 7, memory device 701 can be configured as multi-port (e.g., multi-channel) memory device, such that it can support multiple host devices, such as host devices 702 and 703. For example, memory device can include ports (e.g., channels) 771 and 772 coupled to host devices 702 and 703, respectively, through corresponding connections 781 and 782. Memory device 701 can communicate with host device 702 (e.g., through connection 781) independently from a communication between memory device 701 and host device 703 (e.g., through connection 782). A communication between memory device 701 and host device 702 can occur concurrently with a communication between memory device 701 and host device 703. Host devices 702 and 703 can be configured to perform error detections using different error detection and correction techniques tailored to requirements of respective host devices 702 and 703.

In operation, memory device 701 can provide information (e.g., information obtained from a memory structure in the memory device 701) to host device 702 in response to a command (e.g., read command) sent to memory device 701 by host device 702. In this example, memory device 701 can perform a memory repair operation if memory device 701 receives a notification from host device 702 indicating that an error has occurred in the information. Similarly, memory device 701 can provide information (e.g., information obtained from a memory structure in the memory device 701) to host device 703 in response to a command (e.g., read command) sent to memory device 701 by host device 703. In this example, memory device 701 can perform a memory repair operation if memory device 701 receives a notification from host device 703 indicating that an error has occurred in the information.

FIG. 7 shows memory device 701 coupled to two host devices 702 and 703 as an example. Memory device 701 can be scalable such that fewer or more than two host devices can be supported by memory device 701.

Figure 8:
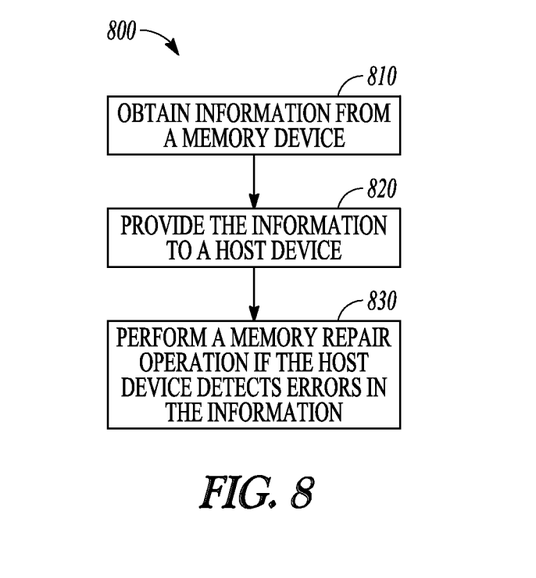
FIG. 8 is a flow diagram showing a method, according to some embodiments described herein.

FIG. 8 is a flow diagram showing a method 800, according to some embodiments described herein. Method 800 can be performed by a memory device and a host device of apparatus, such as apparatus 100, 200, 300, 400, 500, 600, and 700 described above with reference to FIG. 1 through FIG. 7. As shown in FIG. 8, method 800 can include activities 810, 820, and 830.

Activity 810 can include obtaining information from a memory structure in a memory device in response to a read command sent to the memory device by a host device. Obtaining information in activity 810 can be performed by a memory device, such as memory device 101, 201, 301, 401, 501, 601, and 701 described above with reference to FIG. 1 through FIG. 7. The host device that generates the read command can include host device 102, 202, 302, 402, 502, 602, or 702 described above with reference to FIG. 1 through FIG. 7.

Activity 820 of method 800 can include providing the information from the memory device to the host device. Activity 820 can be performed by the same memory device that performs activity 810.

Activity 830 of method 800 can include performing a memory repair operation at the memory device to repair a portion in the memory structure in the memory device. The memory repair operation in activity 830 can be performed after the memory device receives a notification from the host device indicating that the host device has detected an error in the information provided to the host device by the memory device.

Method 800 can include fewer or more activities than the activities shown in FIG. 8. For example, method 800 can include activities associated with the operations of the memory device and host device described above with reference to FIG. 1 through FIG. 7.

The illustrations of apparatuses (e.g., apparatus 100, 200, 300, 400, 500, 600, and 700) are intended to provide a general understanding of the structure of various embodiments and are not intended to provide a complete description of all the elements and features of apparatuses that might make use of the structures described herein.

Any of the components described above with reference to FIG. 1 through FIG. 7 (e.g., control units 220, repair unit 250, control unit 270, and error management unit 280) can include hardware circuitry, single and/or multi-processor circuits, memory circuits, software program modules and objects and/or firmware, and combinations thereof, as desired and/or as appropriate for particular implementations of various embodiments.

The apparatuses (e.g., apparatus 100, 200, 300, 400, 500, 600, and 700) described above may include or be included in electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 8 include apparatuses and methods having a memory structure included in a memory device and a control unit included in the memory device. The control unit can provide information obtained from the memory structure during a memory operation to a host device (e.g., a processor) in response to a command from the host device. If the control unit receives a notification from the host device indicating that the host device has detected an error in the information obtained from the memory structure, then a repair unit included in the memory device performs a memory repair operation to repair a portion in the memory structure. Other embodiments including additional apparatuses and methods are described.

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
    a memory structure included in a memory device;
    a control unit included in the memory device to provide information obtained from the memory structure during a memory operation to a host device in response to a command from the host device; and
    a repair unit included in the memory device to repair a portion in the memory structure in a memory repair operation if the control unit receives a notification from the host device indicating that the host device has detected an error in the information obtained from the memory structure, wherein the repair unit is configured to update a table with information associated with a defective portion in the memory structure if the repair unit repairs the portion in the memory structure in response to the notification from the host device, wherein the table includes information associated with an additional memory repair operation performed before the information from the memory structure in the memory device is provided to the host device.

2. The apparatus of claim 1, wherein the memory device is not configured to perform an error detection operation on the information obtained from the memory structure.

3. The apparatus of claim 1, wherein the control unit is configured to receive from the host device information identifying the error if the error is detected by the host device.

4. The apparatus of claim 3, wherein the information identifying the error includes an address associated with the information obtained from the memory structure.

5. The apparatus of claim 3, wherein the information identifying the error includes a data value associated with the information obtained from the memory structure.

6. The apparatus of claim 3, wherein the information identifying the error includes a data mask identifying a position of an error bit among a group of bits associated with the information obtained from the memory structure.

7. The apparatus of claim 3, wherein the information identifying the error includes a type of the error associated with the information obtained from the memory structure.

8. The apparatus of claim 7, wherein the memory device is configured to use different repair resources to repair the portion in the memory structure based on the type of error.

9. The apparatus of claim 1, wherein the memory device is configured to provide an indication to the host device to indicate a result of a memory repair operation performed by the repair unit to repair the portion in the memory structure.

10. The apparatus of claim 1, wherein the information obtained from the memory structure includes user data stored in the memory structure.

11. An apparatus comprising:
an error management unit to perform an error detection operation on information obtained from a memory structure in a memory device, the memory device included in a first die, the error management unit included in a host device; and
a control unit included in the host device and configured to notify the memory device that the information obtained from the memory structure in the memory device has an error if the error is detected by the error management unit during the error detection operation, wherein the memory device is configured to update a table with information associated with a defective portion in the memory structure if the memory device repairs the portion in the memory structure in a memory repair operation in response to a notification from the host device that the information obtained from the memory structure has the error, wherein the table includes information associated with an additional memory repair operation performed before the information obtained from the memory structure is provided to the error management unit.

12. The apparatus of claim 11, wherein the host device is not configured to perform a memory repair operation on the memory structure in the memory device.

13. The apparatus of claim 11, wherein the error management unit is configured to perform an error correction operation on information obtained from the memory device if the error is detected by the error management unit during the error detection operation.

14. The apparatus of claim 11, wherein the control unit is configured to provide information identifying the error to the memory device if the error is detected by the error management unit during the error detection operation.

15. The apparatus of claim 14, wherein the information identifying the error includes at least one of:
an address associated with the information obtained from the memory structure in the memory device;
a data value associated with the information obtained from the memory structure in the memory device;
a data mask identifying one or more error bits among a group of bits associated with the information obtained from the memory structure in the memory device; and
a type of the error in the information obtained from the memory structure in the memory device.

16. An apparatus comprising:
a host device; and
a memory device to provide information obtained from a memory structure in the memory device to the host device in response to a read command sent to the memory device by the host device, the host device configured to send a notification to the memory device indicating that the information obtained from the memory structure in the memory device has an error if the error is detected by the host device, the memory device configured to perform a memory repair operation to repair a portion in the memory structure if the memory device receives the notification from the host device, wherein the memory device is configured to update a table with information associated with a defective portion in the memory structure if the memory device repairs the portion in the memory structure in response to the notification from the host device, wherein the table includes information associated with an additional memory repair operation performed before the information from the memory structure in the memory device is provided to the host device.

17. The apparatus of claim 16, wherein the memory device is not configured to detect errors in the information obtained from the memory structure.

18. The apparatus of claim 16, wherein the memory device is configured to replace a defective portion in the memory structure with a non-defective portion in the memory structure based on information identifying the error provided to the memory device by the host device.

19. The apparatus of claim 16, wherein the host device is configured to perform an error correction operation on information obtained from the memory device if the error is detected by host device.

20. The apparatus of claim 16, wherein the host device is not configured to store information associated with the memory repair operation performed by the memory device.

21. The apparatus of claim 20, wherein the information associated with the memory repair operation includes an address of a defective portion in the memory structure and an address of another portion in the memory structure that replaces the defective portion.

22. The apparatus of claim 16, wherein the memory device is included in a single die.

23. The apparatus of claim 16, wherein the memory device includes dice arranged in a stack.

24. The apparatus of claim 16, further comprising a printed circuit board, the printed circuit board including conductive paths to carry signals between the host device and the memory device.

25. An apparatus comprising:
a memory die;
a logic die to control operations in the memory die memory such that information provided to and obtained from the memory die is conducted through the logic die; and
a host device included in a die different from the logic die, the host device configured to obtain information from the memory die through the logic die during a memory operation and to notify the logic die to initiate a memory repair operation if the host device detects an error in information obtained from the memory die during the memory operation, wherein one of the memory die and the logic die is configured to update a table with information associated with a defective portion in the memory die if the memory repair operation is performed, wherein the table includes information associated with an additional memory repair operation performed before the information from the memory die is provided to the host device.

26. The apparatus of claim 25, wherein the logic die is not configured to detect errors in information obtained from the memory die.

27. The apparatus of claim 25, wherein the host device is configured to perform an error correction operation on the information obtained from the memory die if the host device detects the error in the information obtained from the memory die during the memory operation.

28. The apparatus of claim 25, wherein the host device is not configured to store information associated with the memory repair operation performed by the logic die.

29. The apparatus of claim 25, further comprising at least one additional memory die arranged in a stack with the memory die, wherein the logic die is configured to control operations in the at least one additional memory die such that information provided to and obtained from the at least one additional memory die is conducted through the logic die.

30. An apparatus comprising:
a first port included in a memory device to provide first information obtained from a memory structure in the memory device to a first host device in response to a first command sent to the memory device by the first host device;
a second port included in the memory device to provide second information obtained from the memory structure to a second host device in response to a second command sent to the memory device by the second host device; and
a repair unit included in the memory device to perform a first memory repair operation if the memory device receives a first notification from the first host device indicating that an error has occurred in the first information, and to perform a second memory repair operation if the memory device receives a second notification from the second host device indicating that an error has occurred in the second information, wherein the memory device is not configured to detect errors in the first information and the second information.

31. The apparatus of claim 30, wherein the first host device and the second host device are configured to perform error detections using different error detection techniques.

32. The apparatus of claim 30, wherein each of the first and second host devices includes one of a processor and an application specific integrated circuit.

33. A method comprising:
obtaining information from a memory structure in a memory device in response to a read command sent to the memory device by a host device;
providing the information from the memory device to the host device; and
performing a memory repair operation at the memory device to repair a portion in the memory structure, wherein the memory repair operation is performed in response to the memory device receiving a notification from the host device indicating that the host device has detected an error in the information provided to the host device, and performing the memory repair operation includes updating a table to include information indicating a link between an address of a defective portion in the memory structure and an address of a portion in the memory structure that replaces the defective portion, wherein the table includes information associated with an additional memory repair operation performed before the information from the memory structure in the memory device is provided to the host device.

34. The method of claim 33, wherein performing the memory repair operation includes storing in the memory device an address of a defective portion in the memory structure and an address of a portion in the memory structure that replaces the defective portion.

35. The method of claim 33, further comprising:
sending an indication to the host device to indicate whether the memory repair operation is successful.

36. The method of claim 33, further comprising:
determining, by the host device, whether the information provided to the host device has an error.

37. The method of claim 33, further comprising:
performing, by the host device, no actions related to the error if the host device receives an indication from memory device that the memory repair operation is successful.

38. The method of claim 33, further comprising:
notifying, by the host device, a user of an unsuccessful memory repair if the host device receives an indication from the memory device that the memory repair operation is unsuccessful.

39. The method of claim 33, further comprising:
switching, by the host device, to using a different memory device if the host device receives an indication from the memory device that the memory repair operation is unsuccessful.

40. The method of claim 33, further comprising sending from the host device to the memory device at least one of:
an address associated with the information obtained from the memory structure in the memory device; and
a type of the error in the information obtained from the memory structure in the memory device.

* * * * *